United States Patent [19]

Gamo et al.

[11] 3,874,956

[45] Apr. 1, 1975

[54] METHOD FOR MAKING A SEMICONDUCTOR SWITCHING DEVICE

[75] Inventors: Hiroshi Gamo; Akira Kawakami, both of Itami, Japan

[73] Assignee: Mitsubishi Denki Kabushiki Kaisha, Tokyo, Japan

[22] Filed: Feb. 19, 1974

[21] Appl. No.: 443,202

Related U.S. Application Data

[63] Continuation of Ser. No. 253,141, May 15, 1972, abandoned.

[52] U.S. Cl. .................. 148/188, 148/1.5, 148/187, 357/38

[51] Int. Cl. ................................................ H01l 7/34

[58] Field of Search ............ 148/1.5, 178, 185, 188, 148/186; 357/38

[56] References Cited

UNITED STATES PATENTS

| | | | |
|---|---|---|---|
| 2,841,510 | 7/1958 | Mayer | 148/1.5 |
| 3,342,651 | 9/1967 | Raithel | 148/188 |
| 3,442,722 | 5/1969 | Bauerlein et al. | 148/178 |
| 3,461,359 | 8/1969 | Raithel et al. | 357/38 |
| 3,487,276 | 12/1969 | Wolley | 357/38 |
| 3,513,363 | 5/1970 | Herlet | 148/186 X |
| 3,645,808 | 2/1972 | Kamiyama et al. | 148/187 |

*Primary Examiner*—G. Ozaki
*Attorney, Agent, or Firm*—Robert E. Burns; Emmanuel J. Lobato; Bruce L. Adams

[57] ABSTRACT

The disclosed method relates to making a semiconductor switching device comprising of a PNPN or NPNP structure having four semiconductor regions, one region of higher specific resistivity of two central regions of the four regions being sandwiched between a centrally positioned junction and one of end junctions of three PN junctions formed between the four regions. The central region of higher specific resistivity involves impurities for controlling the lifetime of carriers, and its concentration distribution being such that the impurity concentration of that portion adjacent to the central junction is higher than that of the portion adjacent to the abovementioned end junction.

9 Claims, 6 Drawing Figures

METHOD FOR MAKING A SEMICONDUCTOR SWITCHING DEVICE

This is a continuation, of application Ser. No. 253,141, filed May 15, 1972, now abandoned.

BACKGROUND OF THE INVENTION

1. Field of the Invention

This invention relates to a method for making a semiconductor switching device and, in particular, to a semiconductor switching device having a wafer including a PNPN structure or an NPNP structure wherein four semiconductor regions are disposed in such relationship that each region is of different conductivity type from the adjacent ones as well as to a method for making the same.

2. Description of the Prior Art

Semiconductor switching devices having a wafer including PNPN structure or NPNP structure are called "thyristors" and widely used as switching elements in electric circuits. When a thyristor is applied to an inverter-chopper device such as a switching device, the thyristor is required to be short in its turn-off time.

The term turn-off time refers to the time required to turn-off the thyristor. It is known that, in case of a thyristor utilizing silicon as a semiconductor material, the turn-off time depends upon the lifetime of the carriers stored in silicon. Therefore, to shorten the turn-off time, it is required to shorten the lifetime of the carriers.

It is also known that the lifetime of the carriers can be shortened by doping with heavy metal atoms such as gold atoms, and the more the heavy metal atoms are doped the shorter the lifetime of the carriers becomes. This is because the heavy metal atoms serve as recombination centers for the carriers injected in the silicon material. Therefore, by doping with the heavy metal atoms, the turn-off time of the thyristor can be shortened. However, the heavy metal atoms involved in the semiconductor material, on the other hand, increase the forward voltage drop in the ON state which is another important property of the thyristor and also increase the leakage current in the OFF state. The increase in forward voltage drop in the ON state results in an increase in power loss in the device and a increase in leakage current results in decrease in blocking voltage in the OFF state, both reducing the commercial value of the device.

The degree of increase in forward voltage drop in the ON state and the degree of decrease in blocking voltage sharply increase when a large amount of heavy metal atoms is doped in the semiconductor material. This trend is especially conspicuous in case of a thyristor produced from a thick silicon wafer with high resistivity. In such a case, it has been confirmed that only a small amount of heavy metal atoms greatly increases the forward voltage drop and greatly decreases the blocking voltage.

In the conventional thyristor containing heavy metal atoms, a central semiconductor region of higher resistivity of two central semiconductor regions is substantially equal in concentration of the heavy metal atoms at those portions adjacent to PN junctions on both sides of that central region. With such a concentration distribution of heavy metal atoms, it has been difficult to satisfy all of the three requirements to decrease the forward voltage drop in the ON state, to increase the blocking voltage, and to shorten the turn-off time of the thyristor.

Accordingly, an object of the invention is to provide an improved and new semiconductor switching device and a method for making the same, wherein the above three requirements — to decrease the forward voltage drop in the ON state, to increase the blocking voltage, and to shorten the turn-off time - are more effectively satisfied.

SUMMARY OF THE INVENTION

According to the present invention, there is provided a method for making a semiconductor switching device comprising a semiconductor wafer including four semiconductor regions disposed in such relationship that each of said four semiconductor regions exhibits a different conductivity type from those of adjacent ones, one central region higher in resistivity of two central regions of said four semiconductor regions being sandwiched between a first junction centrally positioned of three PN junctions formed between said four semiconductor regions and a second junction positioned on one of the ends of said three PN junctions, and said semiconductor wafer including therein impurities for controlling the lifetime of carriers and the concentration of said impurities involved in said central region of higher resistivity being high at that portion adjacent to said first junction relative to that at that portion adjacent to said second junction.

According to another aspect of the invention, there is provided a method for making a semiconductor switching device comprising a first step of converting portions of both sides of a semiconductor wafer in conductivity type from one conductivity type into the other conductivity type to form a first region of the one conductivity type in a central portion of the semiconductor wafer and a second and a third region of the other conductivity type at both sides of said first region, a second step of again converting one portion of said third region in conductivity type into the one conductivity type to form in said third region a fourth region of a conductivity type the same as that of the first region, said second step being carried out after the completion of said first step, and third step of diffusing impurities for controlling the lifetime of carriers into said wafer, said third step being carried out under the condition that a region including phosphorus of high concentration is formed on that portion of said second region opposite to said first region and said third step also being carried out after the completion of said first step.

BRIEF DESCRIPTION OF THE DRAWING

Throughout several Figures the same reference characters designate the identical or corresponding components.

DESCRIPTION OF THE PREFERRED EMBODIMENT

Figure 1A:
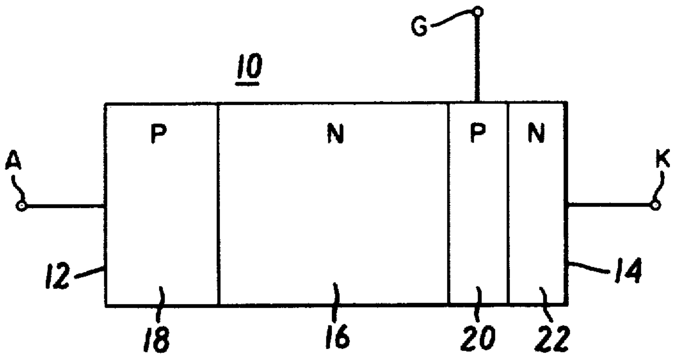
FIG. 1*a* is a schematic diagram of the semiconductor switching device constructed in accordance with the present invention.

Referring now to the drawing and in particular to FIG. 1*a*, wherein a semiconductor switching device of a PNPN structure is schematically illustrated, it is seen that a wafer made of a semiconductor material such as silicon is generally designated by the reference numeral 10. The semiconductor wafer 10 has two substantially parallel surfaces 12 and 14. The wafer 10 is prepared from a silicon monocrystal material of N-conductivity type as a starting material, which remains without any change in the completed wafer 10 as a central N-type layer 16. The resistivity of the central N-type layer 16 is in general not less than several Ω-cm and the thickness thereof is from several tens to several hundreds of microns, measured in the direction normal to the surfaces 12 and 14. At one side of the central N-type layer 16 there is provided an outer or end P-type layer 18 forming therebetween a PN junction $J_1$, and at the other side of the central N-type layer 16 there is provided a central P-type layer 20 also forming therebetween a PN junction $J_2$. These outer and central P-type layers 18 and 20 are formed by diffusing P-type impurity from the substantially parallel two surfaces 12 and 14 of the starting material. The central P-type layer 20 exhibits a resistivity of not more than 0.1 Ω-cm and has a thickness of about 20–50 microns measured in the direction normal to the surfaces of the wafer 10. It is to be noted that the central N-type layer 16 has a higher resistivity and a greater thickness as compared with the central P-type layer 20.

It is also seen that an outer or end N-type layer 22 is formed adjacent to that surface of the central P-type layer 20 remote from the central N-type layer 16. The outer N-type layer 22 forms a PN junction $J_3$ between the same and the central P-type layer 20. This outer N-type layer 22 is formed, for example, by alloying into the central P-type layer 20 a metal containing the N-type impurities which is placed on the surface of the central P-type layer 20. The resistivity of both the outer P-type layer 18 and the outer N-type layer 22 are sufficiently lower than those of the central N-type layer 16 and the central P-type layer 20.

The semiconductor device also comprises an anode terminal A connected in ohmic contact relationship to the outer P-type layer 18, a cathode terminal K connected in ohmic contact relationship to the outer N-type layer 22, and a gate terminal G connected also in ohmic contact relationship to the central P-type layer 20.

It is easily understood that, for a wafer of NPNP structure, the respective layers 16, 18, 20 and 22 should be of opposite conductivity type to those above described.

Figure 1B:
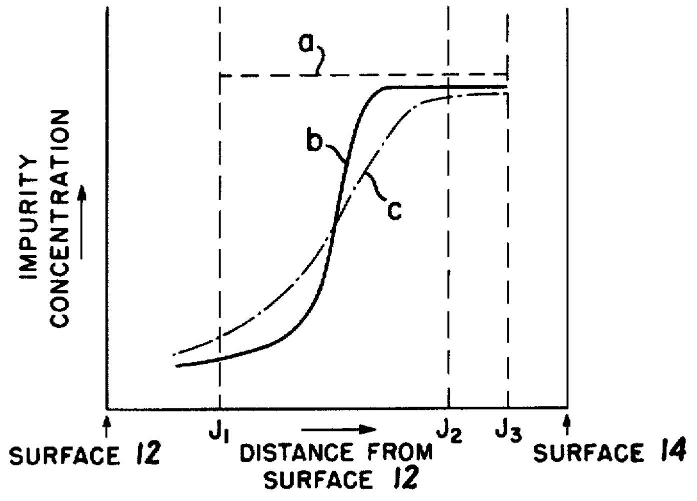
FIG. 1*b* is a graph showing the concentration distribution of the impurity doped in the device illustrated in FIG. 1*a* for controlling the lifetime of the carriers.

FIG. 1*b* shows the impurity concentration distribution of the semiconductor wafer 10 illustrated in FIG. 1*a*. The axis of the abscissa represents the distance from the 12 of the semiconductor wafer 10 and the axis of the ordinate represents the concentration of the impurities of heavy metal atoms such as gold atoms. The curve *a* of the FIGURE represents the concentration distribution of heavy metal atoms in a conventional thyristor, and curves *b* and *c* represent the concentration distributions of the heavy metal atoms in thyristors constructed in accordance with the teachings of the present invention. Comparing the concentration distribution curves of the heavy metal atoms of the wafers of the present invention with that of the conventional device, it is easily understood that the impurity concentration of the conventional wafer at that portion adjacent to the central junction $J_2$ is substantially equal to that at that portion adjacent to the outer junction $J_1$, whereas the impurity concentrations of the wafers of the present invention at that portion adjacent to the junction $J_1$ is much lower than that of the conventional semiconductor wafer.

The concentration distributions of the heavy metal atoms as above described and shown by the curves *b* and *c* have been measured by the inventors through the spreading resistance measurement of resistivity of silicon material after the diffusion of gold utilizing the property of the silicon material of high resistivity that it varies in resistivity when gold is diffused therein.

According to the present invention, the semiconductor switching device is designed to have a lower heavy metal atom concentration at that portion of the central N-type layer 16 adjacent to the outer junction $J_1$ as illustrated by the curve *b* or *c* than that of that portion of the central N-type layer 16 adjacent to the central junction $J_2$. The improved thyristor with the heavy metal atom concentration distribution thus arranged can have a much smaller forward voltage drop in the ON state than the conventional thyristor, for the same turn-off time. On the other hand, for the same forward voltage drop thyristor, the thyristor of the present invention can have a much shorter turn-off time than the conventional thyristor.

The reason for this will now be described in detail.

It is known that the turn-off time $t\delta$ of a thyristor can approximately be expressed by the following equation, which is disclosed, for example, as the equation (2.142) on page 112 of literature entitled "Semiconductor Controlled Rectifiers" published in 1964 by Prentice-Hall, Inc., Englewood Cliffs, N.J.

$$t\delta = \tau_p \times \ln \frac{I_T}{I_H} \quad (1)$$

where, $\tau_p$ is the lifetime of carriers in the central N-type layer 16, $I_T$ is forward current in the ON state of the thyristor, and $I_H$ is a holding current necessary to hold the ON state. It is to be noted that the turn-off time $t\delta$ of the thyristor can be considered to be proportional mainly to the lifetime $\tau_p$ of the carriers in the central N-type layer 16 because the value of the term $Ln I_T/I_H$ does not depend upon the lifetime of the carriers so much.

To turn-off a thyristor in practical application, it is common to apply a reverse voltage so that the cathode electrode K becomes positive with respect to the anode electrode A, causing almost all the carriers which are accumulated in the central N-type layer 16 during the ON state to sweep out as a reverse current, and since the reverse voltage is applied to the PN junction $J_1$ to expand a depletion layer mainly toward high resistivity side of the junction $J_1$, or into the central N-type layer 16, almost all of the carriers in the vicinity of the junction $J_1$ vanish within a short period of time through the sweep out process. However, the carriers in the vicinity of the junction $J_2$ do not vanish immediately. These carriers in the vicinity of the junction $J_2$ are considered to vanish only through recombination process. Accordingly, the lifetime $\tau_p$ of the carriers in the equation (I) can be deemed to be the lifetime of the carriers in that portion of the central N-type layer 16 adjacent to the central junction $J_2$. Also, the turn-off time of the thyristor can be considered to be determined mainly in accordance with the lifetime of the carriers involved in that portion of the central N-type layer 16 adjacent to the central junction $J_2$. In other words, it can be considered that the turn-off time $t\delta$ is determined by the concentration of the heavy metal atoms in that portion of the central N-type layer 16 adjacent to the central junction $J_2$.

On the other hand, it is known that the forward voltage drop $V_T$ under the conditions that the thyristor is in its ON state can approximately be expressed by the following equation, which is disclosed as the equation (22) on page 155 of an American magazine "Radio Engineering & Electron Physics," 1963, Vol. 8.

$$V_T = \frac{kT}{q}\left(\delta \times e^{\frac{W_n}{2L}} + \ln \frac{I_T}{I_{SO}}\right) + I_T \times R \qquad \text{(II)}$$

where, $I_T$ is forward current in the ON state of a thyristor, R is resistance of an electrode to be in contact with the wafer 10 of the thyristor, $I_{SO}$ is saturation current of the outer junction $J_1$, $\delta$ is a constant ranging from 1 to 1.8, $W_n$ is thickness of the central N-type layer 16 as measured in the direction normal to the surfaces 12 and 14, L is a diffusion length of holes in the central N-type layer 16, q is unit electric charge, k is Boltzmann's constant, and T is absolute temperature.

It is also known that the following relationships are held between the diffusion length L of holes in the central N-type layer 16 and the saturation current $I_{SO}$ of the junction $J_1$:

$$L \approx \sqrt{D_p \times \tau_p} \qquad \text{(III)}$$

$$I_{SO} \propto \frac{1}{L} \propto \tau_p^{-\frac{1}{2}} \qquad \text{(IV)}$$

where, $D_p$ is diffusion coefficient.

As apparent from these equations (III) and (IV), each of the diffusion length L and the saturation current $I_{SO}$ is a function of the lifetime $\tau_p$ of the carriers in the central N-type layer 16. Therefore, the terms that concern the lifetime $\tau_p$ of the carriers in the central N-type layer 16 are the terms $\delta \times e\ W_n/2L$ and $ln\ I_T/I_{SO}$.

The first term, i.e., the term $\delta \times e\ W_n/2L$, can be transformed, by using the equation (III), as follows:

$$\delta \times e^{\frac{W_n}{2L}} = \delta \times e^{\frac{W_n}{2\sqrt{D_p \times \tau_p}}}$$

In the equation (V), it is to be noted that the lifetime $\tau_p$ of the carriers in the central N-type layer 16 is the mean value.

In a thyristor having the concentration distribution of heavy metal atoms as shown by the curve *a* in FIG. 1*b*, the lifetime $\tau_p$ of the carriers in the central N-type layer 16 has a substantially constant value irrespective of the distance from the surface of the wafer, and that value equals at every point the value of the lifetime of the carriers in that portion adjacent to the central junction $J_2$ necessary for obtaining a desired turn-off time.

On the contrary, in the thyristor of the invention which has the concentration distribution of heavy metal atoms as shown by the curve *b* or *c* of FIG. 1*b*, the concentration of heavy metal atoms at that portion of the central N-type layer 16 adjacent to the central junction $J_2$ is almost equal to that of the conventional semiconductor wafer, thereby to obtain substantially the same lifetime $\tau_p$ of the carriers in the vicinity of the central junction $J_2$, whereas the concentration of the heavy metal atoms is lowered in the vicinity of the junction $J_1$ which is away from the center junction $J_2$, thereby to obtain a sufficiently long lifetime $\tau_p$ of the carriers in the vicinity of the junction $J_1$. This enables the mean value of the lifetime $\tau_p$ of the carriers within the central N-type layer 16 to be longer than the lifetime of the conventional device. As a result, the diffusion length L of the holes in the central N-type layer 16 becomes longer than that of the conventional device. Therefore, according to the present invention, the term of $\delta \times e\ W_n/2L$ can be reduced thereby to decrease the value of the forward voltage drop $V_T$. The decrease in the value of the term $\delta \times e\ W_n/2L$ provides a great effect which will be later described in conjunction with the embodiment of the invention.

Considering now the term of $ln\ I_T/I_{SO}$, it is apparent from the equation (IV), that the saturation current $I_{SO}$ of the junction $J_1$ decreases due to the increase in diffusion length L of the holes in the central N-type layer 16 as compared with that of the conventional design. Although the value of the term $I_T/I_{SO}$ increases because of decrease in saturation current $I_{SO}$, the amount of increase in the value of $ln\ I_T/I_{SO}$ which is a logarithmic value of $I_T/I_{SO}$ is sufficiently small and negligible in comparison with the amount of decrease in the value of the term of $\delta \times e\ W_n/2L$.

Thus, when the concentration of the heavy metal atoms of the central N-type layer 16 in the vicinity of the central junction $J_2$ is designed to have the same value as that of the conventional device, the forward voltage drop under the ON state can be reduced to be sufficiently small as compared with that of the conventional device. On the other hand, upon applying the concentration distribution of the heavy metal atoms according to the invention to a semiconductor wafer, if the mean value of the concentration of the heavy metal atoms throughout the entire central N-type layer 16 is selected to be the same value as that of the conventional thyristor, the forward voltage drop in the ON state is equal to that of the conventional device. The turn-off time of that device, however, can be shortened because the concentration of the heavy metal atoms of the central N-type layer 16 in the vicinity of the central junction $J_2$ becomes higher than that of the conventional device. This will be easily understood from the foregoing description.

According to the present invention there is provided an improved thyristor wherein the concentration of the heavy metal atoms of the central N-type layer 16 in the vicinity of the central junction $J_2$ which contributes to shortening the turn-off time is selected to be high relative to that in the vicinity of the junction $J_1$, thereby to decrease the turn-off time of the device and, at the same time, the concentration of the heavy metal atoms of the central N-type layer 16 in the vicinity of the end junction $J_1$ which does not contribute to shortening the turn-off time is selected to be low relative to that in the vicinity of the junction $J_2$, thereby to maintain a longer mean lifetime of the carriers within the central N-type layer 16 to decrease the forward voltage drop in the ON state.

The invention will now be described in conjunction with FIG. 2, wherein an embodiment of the present invention is illustrated, along the manufacturing steps of the illustrated device in comparison with those of the conventional device.

Figure 2:
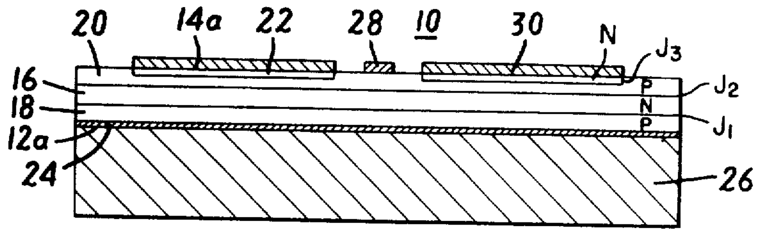
FIG. 2 is a sectional view of one embodiment of the semiconductor switching device constructed in accordance with the present invention.

In both FIGS. 1*a* and 2, the same or identical components illustrated in FIG. 1*a* are designated by the common reference characters for easy understanding. It is seen that a circular discal semiconductor wafer 10 has two surfaces 12*a* and 14*a* parallel to each other. The wafer 10 is 24(mm) in diameter and 330 microns in thickness prepared from a silicon monocrystal substrate having the N-conductivity type and a resistivity of 50Ω-cm. This wafer 10 is prepared as a starting material in a first step. In a second step, gallium is diffused as P-type impurity into the wafer 10 from both the surfaces 12*a* and 14*a* to form another P-type end layer 18 and a central P-type layer 20, thereby to form a PNP three-layer structure. The conditions under which the diffusion of gallium is achieved are such as to provide a surface concentration of $5 \times 10^{17}$ atoms/cm$^3$ and a diffusion length of 75 microns.

According to the conventional manufacturing method, heavy metal atom diffusion such as gold diffusion has been applied directly to the PNP three-layer structure immediately after the second step. This diffusion has been achieved, according to the conventional method, by attaching gold on the entire surfaces 12*a* and 14*a* of the wafer 10 of the PNP three-layer structure and, thereafter, the wafer 10 is heated to an elevated temperature in the atmosphere of inactive gas such as dried nitrogen gas atmosphere thereby to diffuse the element gold into the wafer 10. To attach the metal on the surface of the wafer a vacuum evaporation technique or the like has been applied. The wafer 10 of the conventional thyristor prepared by the conventional method as has been described exhibits substantially constant concentration of gold within the central N-type layer 16 as seen from the curve of FIG. 1*b*.

According to the method of the present invention, the surface 12*a* on the side of the outer P-type layer 18 of the wafer 10 of the PNP three-layer structure prepared by the second step is entirely covered with a phosphorus doping layer which has a thickness of several microns. Although the formation of this phosphorus doping layer may also be achieved through various other methods, the diffusion method was used in the case of the embodiment illustrated in FIG. 2. This diffusion was achieved by first removing a film of silicon oxide produced on the surfaces 12*a* and 14*a* during the diffusion of gallium. Then the wafer 10 is heated to an elevated temperature in an atmosphere of a vapor of phosphorus oxychloride or phosphorus pentoxide. The phosphorus doping layer was formed to have a surface impurity concentration of more than $2\text{–}10 \times 10^{19}$ atoms/cm$^3$. To obtain such a surface impurity concentration, the wafer 10 is required to be heated at a temperature of more than 1,000°C for 30 minutes or more.

Thereafter, the oxidized silicon film of the silicon layer on the surface 14*a* is removed from the entire surface 14*a*, and a gold layer is deposited throughout the surface 14*a*. At the time of depositing the gold layer on the surface 14*a*, another gold layer may be deposited also on the entire surface of the phosphorus doping layer after the oxidized silicon film produced on the phosphorus doping layer surface has been removed therefrom. These depositions of gold layers can be achieved by vacuum evaporation or the like as in the case of the conventional device. The wafer 10 on which gold layer deposition has been completed is then heated at an elevated temperature in an atmosphere of an inactive gas such as a dried nitrogen gas atmosphere as in the conventional method, thereby to diffuse the gold atoms contained in the gold layer into the wafer 10. The wafer 10, after the gold diffusion has been completed is then subjected to treatments for removing the residual gold layer on the surface 14*a*, and the phosphorus doping layer on the surface 12*a*. Thus, a wafer of a PNP three-layer structure in which the gold diffusion has been completed is provided as a third step of the manufacturing method.

Figure 3:
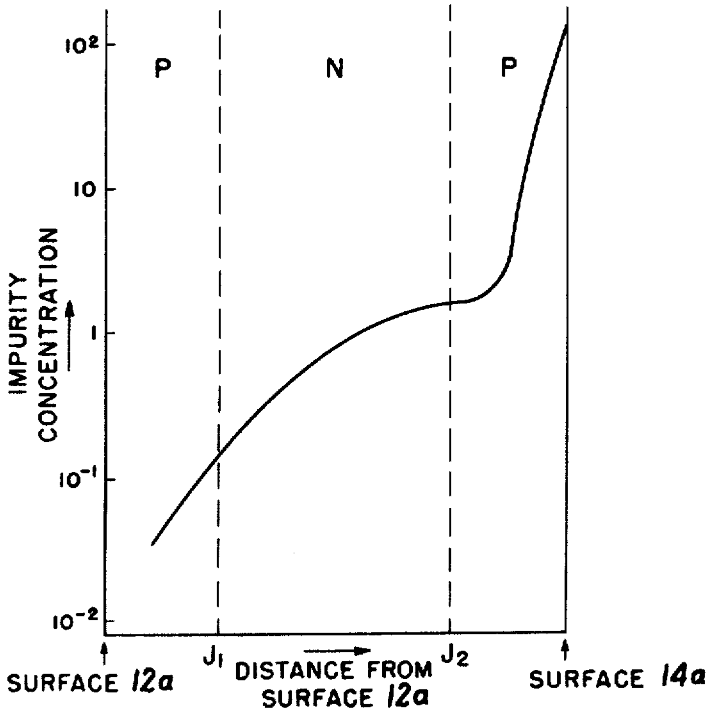
FIG. 3 is a graph showing the measured concentration distribution of the impurity doped into the semiconductor switching device of the invention for controlling the lifetime of the carriers.

FIG. 3 shows the concentration distribution of the gold atoms in the wafer 10 of the PNP three-layer structure after the gold diffusion has been completed. In the Figure, the axis of the abscissa represents the distance from the surface 12*a* of the wafer 10 and the axis of the ordinate represents the concentration of gold atoms. The concentration distribution of the gold atoms shown in FIG. 3 was confirmed by the inventors through the measurement of the variation in resistivity of silicon by the spreading resistance measurement and well-known methods of radio-activation analysis. As apparent from FIG. 3, the concentration of gold atoms in the central N-type layer 16 has its maximum value at that portion adjacent to the junction $J_2$ and decreases continuously toward the junction $J_1$ to exhibit a minimum value at that portion adjacent to the junction $J_1$. The maximum value of the concentration is greater by 2 to 5 times than the minimum value thereof. According to various experiments, the maximum value should have a value of more than 1.2 times the minimum value to obtain the previously described effects of the present invention. Preferably, the maximum value has a value of more than 1.5 times the minimum value.

The concentration distribution of gold as shown in FIG. 3 is realized by the presence of the phosphorus doping layer deposited prior to the diffusion of gold. The phosphorus doping layer having an impurity concentration of more than $2\text{–}10 \times 10^{19}$ atoms/cm$^3$ serves to lower the concentration of gold atoms on that side where the layer is applied or on that side of the surface 12*a* relative to the concentration of gold atoms on that side where the layer is not applied or on that side of the surface 14*a*.

On the surface 12*a* of the wafer 10 of the PNP three-layer structure after the gold diffusion has been completed, there is disposed a molybdenum plate 26 sandwiching therebetween an aluminium foil 24, whereas the surface 14*a* is provided at its central portion with a gold-boron foil 28. In addition, a gold-antimony foil 30 is disposed on the outer periphery thereof. These foils 24, and 30 and the molybdenum plate 26 are brought into pressure contact as they are placed as described above to be heated and alloyed. By this treatment of heating and alloying the molybdenum plate 26 is attached to the surface 12*a* defined by the outer P-type layer 18 of the wafer 10 through the aluminium foil 24 to construct an ohmic contact connected to the anode electrode A. The gold-antimony foil 30 is attached to the center P-type layer 20 while alloying N-type impurities (antimony) to form the annular outer N-type layer 22 in one side of the surface 14*a* of the central P-type layer 20 and, at the same time, to construct an ohmic contact connected to the cathode K on the outer N-type layer 22. This outer N-type layer 22 is formed as though it is inserted from the surface 14*a* into the central P-type layer 20 and the surface 14*a* becomes a common surface of these layers 20 and 22. The gold-boron foil 28 is attached to the central portion of the central P-type layer 20 on that side of the surface 14 by alloying the P-type impurities and boron into the central P-type layer 20 to form an ohmic contact on the central P-type layer 20 connected to the gate electrode G.

After these heating and alloying treatments have been completed, the wafer 10 is treated by chemical etching to expose the clean junctions $J_1$ and $J_2$. Thereafter, an insulating material such as silicone varnish or silicone rubber is applied to the periphery of the wafer 10 it is not illustrated. This insulating material is solidified to provide a protection for the junctions $J_1$ and $J_2$. Although not illustrated the completed wafer 10 is placed in an unillustrated outer shell to form a complete semiconductor switching device.

It is to be noted that although the outer N-type layer 22 has been described as being formed by alloying the gold-antimony foil 30 into the central P-type layer 20, this layer may also be formed by the well-known diffusion technique of the N-type impurities from the surface 14 into the central P-type layer 20. In this case, the phosphorous doping and the gold diffusion process already described are carried out after N-type layer 22 has been formed.

Figure 4:
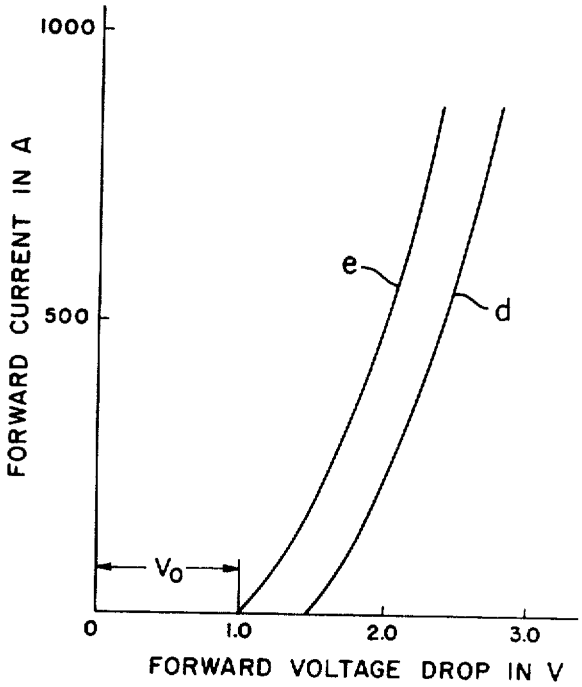
FIGS. 4 and 5 are graphs showing characteristics of the semiconductor switching device of the invention in comparison with the conventional device.

The thyristor constructed in accordance with the present invention and the conventional thyristor will now be compared in terms of the forward voltage drop in the ON state, the turn-off time and the characteristic of the blocking voltage. The comparison will be first made in terms of the properties under the condition that the temperature $T_j$ of the junction is at 115°C for both the thyristor of the invention and a conventional thyristor designed to have substantially the same turn-off time of from 18 to 20 microseconds. The conventional thyristor which exhibits the turn-off time of that order has a forward voltage drop of from 2.2 to 2.4 volts when a current of 500 A flows. On the other hand, it was confirmed that the thyristor constructed in accordance with the present invention provides a forward voltage drop of from 1.8 to 2.0 volts under the same conditions, exhibiting a great effect. FIG. 4 shows the voltage-to-current characteristics of both the present and the conventional thyristors. The axis of the abscissa of the graph represents the forward voltage drop in the ON state of the thyristor and the axis of the ordinate represents the magnitude of the current flowing therethrough. The curve *d* shows the voltage-to-current characteristic of the conventional thyristor whereas the curve *e* shows that of the thyristor of the present invention. From these curves it is seen that the forward voltage drop of the thyristor of the invention is lower than that of the conventional thyristor with equal current flowing therethrough. It is also seen that, according to the present invention, the voltage drop $V_0$ when current begins to flow is lower. This decrease in forward voltage drop shows that the value of the term $\delta \times e\ W_N/2L$ of the equation (II) has been decreased.

Figure 5:
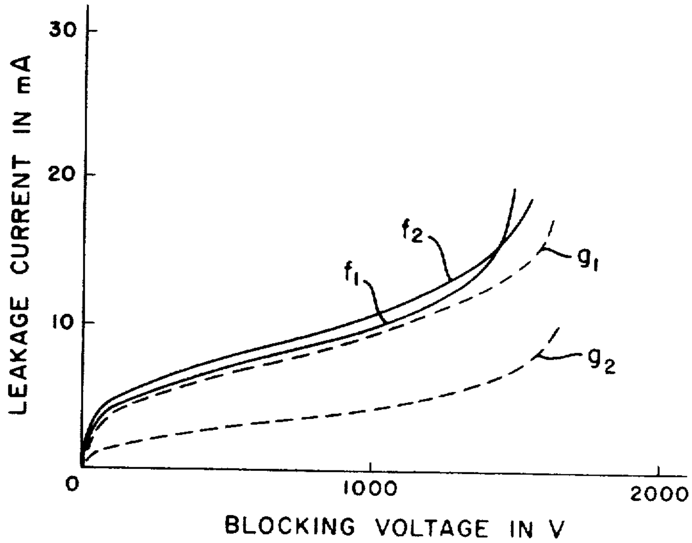

FIG. 5 shows the leakage current-to-voltage characteristics of both the thyristors of the present invention and the conventional design with a temperature $T_j$ at the junction of 115°C. The curve $f_1$ shows the relationship between the voltage and the leakage current of the conventional thyristor when it is in the OFF state due to the application of a forward voltage or a voltage of such polarity that the anode electrode A becomes positive with respect to the cathode electrode K, and curve $f_2$ shows the relationship between the voltage and the leakage current of the thyristor of the present invention when it is in the OFF state due to the application of a forward voltage to the thyristor. Curves $g_1$ and $g_2$ show the relationship between the voltage and the leakage current of thyristors which are in the OFF state due to the application of a reverse voltage or a voltage of such polarity that the cathode K becomes positive with respect to the anode electrode A. The curves $g_1$ and $g_2$ show the characteristics of the thyristors of the conventional design and of the present invention respectively. It is apparent from these curves that, with the thyristor of the present invention, the leakage current upon application of a reverse voltage is remarkably reduced, resulting in an increase of the blocking voltage for the reverse voltage.

The fact that the leakage current upon the application of the reverse voltage is greatly reduced in comparison with that of the application of the forward voltage tells that the concentration of gold atoms of the central N-type layer 16 in the vicinity of the end junction $J_1$ is sufficiently low compared with the concentration of gold atoms in the vicinity of the central junction $J_2$.

When each of the thyristors of the conventional design and of the present invention is arranged to have a forward voltage drop of about 2.4 volts when a current of 500 A flows in the ON state, the turn-off time of the thyristor of the present invention can be shortened to as low as from 10 to 15 microseconds, while the conventional thyristor exhibits a turn-off time of from 18 to 20 microseconds.

Although the invention has been described in terms of an embodiment wherein gold is diffused to provide the heavy metal atoms for controlling the lifetime of the carriers, another element which behaves similarly to gold such as iron or copper can also be used as the heavy metal. When iron or copper is used its concentration distribution can also be controlled owing to the presence of the phosphorus doping layer which has the concentration distribution as heretofore described.

What we claim is:

1. A method for processing a semiconductor wafer comprising the steps of:

a. providing a semiconductor wafer having first and second main surfaces;

b. diffusing an impurity into said wafer having a lower impurity concentration in the vicinity of said first main surface by
   i. forming a high concentration phosphorus-containing region adjacent to said first main surface by forming a phosphorus-containing layer on at least said first main surface and heating the wafer and the phosphorus-containing region,
   ii. then forming an impurity layer on at least said second main surface,
   iii. then diffusing the impurity by heating the wafer and said impurity layer;
c. removing the undiffused portion of said phosphorus-containing layer from said first main surface; and
d. attaching a cathode electrode to said second main surface and an anode electrode to said first main surface after the removing of the undiffused portion of said phosphorus-containing layer.

2. A method for processing a semiconductor wafer as claimed in claim 1, wherein said phosphorus-containing region is formed by diffusing phosphorus from said first and second main surfaces and said phosphorus-containing region exhibits a phosphorus surface concentration of at least $2 \times 10^{19}$ atoms/cm$^3$.

3. A method for processing a semiconductor wafer as claimed in claim 1, wherein said impurity is gold.

4. A method for processing a semiconductor wafer according to claim 1, further comprising the step of attaching a gate electrode to said second main surface after the diffusing step.

5. A method for processing a semiconductor wafer as claimed in claim 1, wherein said step of providing comprises the step of forming at least a first, second and third region, said first region being of a first conductivity type and situated adjacent to said first main surface, said second region being of a second conductivity type and junctioned to said first region, forming therebetween a first PN junction, and said third region being of the first conductivity type and junctioned to said second region, forming therebetween a second PN junction and situated adjacent to said second main surface.

6. A method for processing a semiconductor wafer as claimed in claim 5, further comprising a step of forming a fourth region of the second conductivity type in said third region forming a third P-N junction therebetween before the steps of attaching the cathode electrode and the gate electrode.

7. A method for processing a semiconductor wafer as claimed in claim 1, further comprising the step of removing the undiffused portion of the impurity layer remaining on said second main surface after the step of diffusing the impurity and before the step of attaching the cathode electrode and the anode electrode.

8. A method for producing a semiconductor switching element comprising the steps of: providing a semiconductor wafer having first and second main surfaces and having three opposed regions of alternate conductivity types collectively defining two p-n junctions wherein the central region is composed of material having a greater resistivity than that of one outer region; forming an impurity concentration which increases from a first value at the junction defined by said central region and the other outer region to a second value greater than 1.2 times said first value at the junction defined by said central region and said one outer region by first forming a phosphorus layer on said first main surface, heating the wafer and the phosphorus layer to form a phosphorus-containing region adjacent to said first main surface, forming an impurity layer on said second main surface, and then diffusing impurities into said wafer at said second main surface by heating the wafer and impurity layer; then removing the undiffused portion of the phosphorus layer from said first main surface; then forming a region of the opposite conductivity type from said one outer region on said one outer region by alloying impurities on said one outer region; and then attaching an anode electrode to said first main surface and a cathode electrode to said second main surface.

9. A method according to claim 8, wherein the diffused impurity comprises one element selected from a group consisting of gold, iron, and copper.

* * * * *